(12) United States Patent
Chen et al.

(10) Patent No.: US 10,600,775 B2
(45) Date of Patent: Mar. 24, 2020

(54) ELECTROSTATIC DISCHARGE PROTECTION DEVICE

(71) Applicant: Macronix International Co., Ltd., Hsinchu (TW)

(72) Inventors: Hsin-Liang Chen, Hsinchu (TW); Tzu-Yi Hung, Kaohsiung (TW); Min-Hsin Wu, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 491 days.

(21) Appl. No.: 15/584,392

(22) Filed: May 2, 2017

(65) Prior Publication Data

US 2018/0323183 A1 Nov. 8, 2018

(51) Int. Cl.
*H01L 27/02* (2006.01)
*H01T 4/10* (2006.01)

(52) U.S. Cl.
CPC ............ *H01L 27/0259* (2013.01); *H01T 4/10* (2013.01)

(58) Field of Classification Search
CPC ............ H01L 27/0251; H01L 27/0259; H01L 27/0266; H01L 27/0207; H01L 21/823418; H05F 3/04; H01T 4/10

USPC ........................................................ 361/111
See application file for complete search history.

(56) References Cited

U.S. PATENT DOCUMENTS

| | | | |
|---|---|---|---|
| 7,995,316 B2 | 8/2011 | Carpenter, Jr. et al. | |
| 8,519,434 B2 | 8/2013 | Chen et al. | |
| 8,546,917 B2 | 10/2013 | Chen et al. | |
| 8,664,690 B1 | 3/2014 | Chen et al. | |
| 2012/0241900 A1* | 9/2012 | Chen ................... | H01L 27/0259 257/503 |
| 2012/0286362 A1* | 11/2012 | Chan ................... | H01L 21/8249 257/337 |
| 2016/0285262 A1 | 9/2016 | Chao | |

* cited by examiner

Primary Examiner — Kevin J Comber
(74) Attorney, Agent, or Firm — Fish & Richardson P.C.

(57) ABSTRACT

An electrostatic discharge protection device includes: a semiconductor substrate; an N-type doped well on the substrate, the N-type doped well including a first N+ region and a first P+ region; a P-type doped well on the substrate, the P-type doped well including a second N+ region, a third N+ region, and a second P+ region between the second N+ region and the third N+ region; and a first contact positioned above a surface of the N-type doped well between the first N+ region and the first P+ region.

14 Claims, 6 Drawing Sheets

ELECTROSTATIC DISCHARGE PROTECTION DEVICE

BACKGROUND

Electrostatic discharge (ESD) includes the sudden flow of electricity between two electrically charged objects caused by contact, an electrical short, or dielectric breakdown. ESD events can occur for an extremely short period of time, e.g., on the order of several nanoseconds, during which very high currents may be generated. When an ESD event occurs in a semiconductor integrated circuit (IC), such high currents, which may reach several amperes, have the potential to irreversibly damage the IC. To protect the IC from damage resulting from ESD events, an electrostatic discharge protection structure may be provided that discharges the high current along a path away from the IC.

SUMMARY

The present disclosure relates to an electrostatic discharge protection device.

In general, in a first aspect, the subject matter of the present disclosure is embodied in an ESD protection device that includes: a semiconductor substrate; an N-type doped well on the substrate, the N-type doped well comprising a first N+ region and a first P+ region; a P-type doped well on the substrate, the P-type doped well comprising a second N+ region, a third N+ region, and a second P+ region between the second N+ region and the third N+ region; and a first contact positioned above a surface of the N-type doped well between the first N+ region and the first P+ region.

Implementations of the ESD protection device can include one or more of the following features. For example, in some implementations, the device includes an additional N-type doped well, in which the N-typed doped well and the P-typed doped well are arranged in the additional N-type doped well. The N-type doped well can be separated from the P-typed doped well by the additional N-type doped well. The additional N-type doped well can include an N-type epitaxial layer, an N+ buried layer or multiple N+ buried layers.

In some implementations, the device includes an oxide layer on the surface of the N-type doped well, in which the first contact is arranged on the oxide layer.

In some implementations, the device includes a field oxide between the first P+ region and the second N+ region. The device can include a second contact arranged on the field oxide, in which the second contact is electrically coupled to the cathode. The second contact can be polysilicon or metal. The field oxide can be a shallow trench isolation layer.

In some implementations, the P-type doped well includes a P+ buried layer or a P− implant layer.

In some implementations, the N-type doped well includes an N− implanted layer.

In some implementations, the first P+ region, the N-type doped well and the second P+ region form a first transistor, the N-type doped well, the P-type doped well and the second N+ region form a second transistor, in which the N-type doped well provides a first well resistance between a base of the first transistor and a collector of the second transistor, and the N-type doped well, the P-type doped well and the third N+ region form a third transistor, in which the P-type doped well providing a second well resistance between an emitter of the second transistor and an emitter of the third transistor. The first contact can be electrically tied to an anode and to either the first N+ region or the first P+ region. The second N+ region, the third N+ region, and the second P+ region can be electrically tied to a cathode, in which the first, second and third transistors are configured and arranged to provide conductions paths between the anode and the cathode that activate at different breakdown voltages. The first transistor can be operable to turn on when a first voltage is applied to the anode, the second transistor can be operable to turn on when a second voltage is applied to the anode, the third transistor can be operable to turn on when a third voltage is applied to the anode, in which the third voltage is greater than the second voltage, and the second voltage is greater than the first voltage.

In another aspect, the subject matter of the present disclosure is embodied in an ESD protection circuit including: a first bipolar junction transistor, in which an emitter of the first bipolar junction transistor is electrically coupled to a base of the first bipolar junction transistor by a first resistance, and the first bipolar junction transistor is operable to turn on when a first voltage is applied to the emitter of the first bipolar junction transistor; a second bipolar junction transistor, in which a collector of the second bipolar junction transistor is coupled to the base of the first bipolar junction transistor by a second resistance, and the second bipolar junction transistor is operable to turn on when a second voltage is applied to the emitter of the first bipolar junction transistor, the second voltage being greater than the first voltage; and a third bipolar junction transistor, in which a collector and a base of the third bipolar junction transistor are tied to the collector and a base, respectively, of the second bipolar junction transistor, the base of the third bipolar junction transistor is electrically coupled to an emitter of the third bipolar junction transistor by a third resistance, and the third bipolar junction transistor is operable to turn on when a third voltage is applied to the emitter of the first bipolar junction transistor, the third voltage being greater than the second voltage.

Implementations of the device can include one or more of the following features. For example, in some implementations, the first bipolar junction transistor, the second bipolar junction transistor, and the third bipolar junction transistor are integrated within a single semiconductor substrate. A collector of the first bipolar junction transistor can be tied to the emitter of the second bipolar junction transistor. The first bipolar junction transistor can be a PNP transistor, the second bipolar junction transistor can be an NPN transistor, and the third bipolar junction transistor can be an NPN transistor. The emitter of the third bipolar junction transistor can be electrically coupled to ground. The base of the second bipolar junction transistor can be tied to an emitter of the second bipolar junction transistor.

In another aspect, the subject matter of the present disclosure can be embodied in a method of fabricating an ESD protection device, the method including: providing a substrate; forming a first N-type well on the substrate; forming a second N-type well and a first P-type well within the first N-type well; forming a first N+ region and a first P+ region within the second N-type well, in which the first N+ region and the first P+ region are spaced apart within the second N-type well; forming a second N+ region, a second P+ region, and a third N+ region within the first P-type well, in which the second P+ region separates the second N+ region from the third N+ region; forming a first oxide layer, in which the first oxide layer is between the first P+ region and the second N+ region; forming a second oxide layer, in which the second oxide layer is positioned between the first N+ region and the first P+ region; and forming a contact layer on the first oxide layer and on the second oxide layer.

Implementations of the devices and methods disclosed herein can have various advantages. For example, in some implementations, the electrostatic discharge protection device can be fabricated using a triple well process, such that the use of additional masks and/or process steps during circuit manufacturing are unnecessary. In some implementations, the electrostatic discharge protection device provides a low trigger voltage so that the risk of damage resulting from a high voltage device reaching a breakdown voltage before the ESD device turns on can be reduced. In some implementations, the ESD protection device utilizes a field plate technique to reduce the field-plate effect that results from concentration of current in a surface or drain edge during an ESD event. Furthermore, relative to diode-based, bipolar junction transistor (BJT)-based, or metal-oxide-semiconductor (MOS)-based ESD protection devices that exhibit comparable performance, the ESD protection devices of the present disclosure may be fabricated, in some implementations, utilizing a smaller overall area.

The details of one or more implementations of the invention are set forth in the accompanying drawings and the description below. Other features and advantages of the invention will be apparent from the description, the drawings, and the claims.

DETAILED DESCRIPTION

Figure 1:
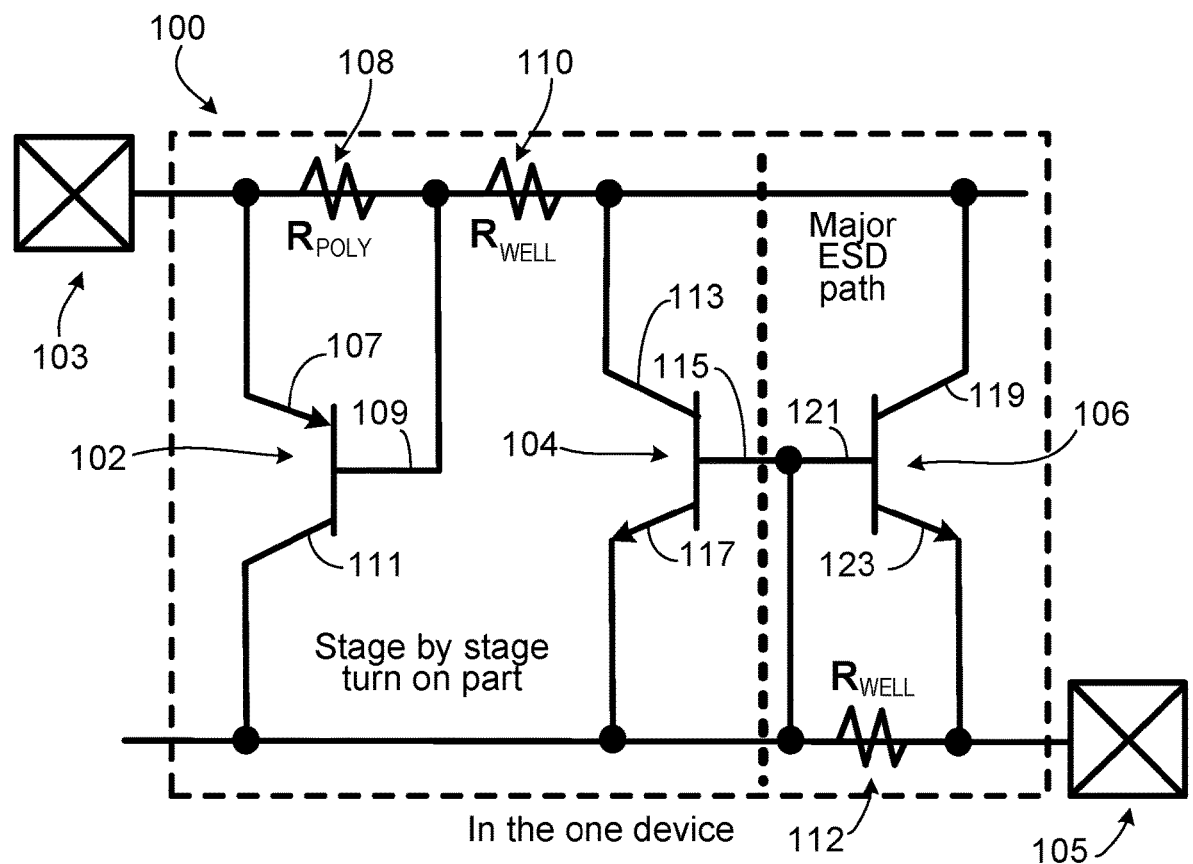
FIG. 1 is a circuit schematic that illustrates an example of an ESD protection device.

Modern electronic devices often require electronic circuitry that performs both actuation functions (e.g., switching devices) and data processing. The use of low-voltage complementary metal-oxide-semiconductor (CMOS) technology for these functions may not always be practical. Thus, high voltage devices have also been developed to handle applications where low-voltage devices are not suitable.

High-voltage devices, including MOSFETs, often require a low on-state resistance (Rdson). However, the low on-state resistance tends to result in ESD current concentrating in the surface or the drain edge of a device during an ESD event. The resulting high current and high electric fields may cause physical damage at a surface junction region of such a device, thus impairing or destroying the device. Because of the requirement that such devices maintain a low on-state resistance, the surface or lateral rules associated with the device cannot be increased, which would otherwise lead to an increase in the high-voltage device on-state resistance.

High-voltage devices also tend to have high breakdown voltages, which is higher than the operating voltage. In some cases, the trigger voltage (Vtl) of an ESD protection device is significantly higher than the breakdown voltage. As a result, during an ESD event, the internal circuitry of the high-voltage device may be at risk of damage before the ESD protection device even turns on.

In some cases, low holding voltages result in unwanted noise (associated with, e.g., a power-on peak voltage or a surge voltage) triggering operation of an ESD protection device or lead to latch-up during normal operation. Additionally, high-voltage devices may experience the so-called "field plate effect" due to electric field distribution during an ESD event in which current concentrates at the surface or drain edge.

The present disclosure relates to an ESD protection device configured to be turned on in stages, in which the ESD protection device has a relatively low trigger voltage. The ESD protection device may have various advantages. For example, in some implementations, the ESD protection device can be fabricated using triple well process and/or bipolar CMOS-DMOS (BCD) process, such that the use of additional masks and/or process steps during circuit manufacturing are unnecessary. The relatively lower trigger voltage reduces, in some implementations, the risk of damage that results from a high voltage device reaching a breakdown voltage before the ESD device turns on. The ESD protection device utilizes a field plate technique (e.g., using an electrically conducting layer over the field oxide) to reduce, in certain cases, the field-plate effect that results from concentration of current in a surface or drain edge during an ESD event. Furthermore, relative to diode-based, bipolar junction transistor (BJT)-based, or metal-oxide-semiconductor (MOS)-based ESD protection devices that exhibit comparable performance, the ESD protection devices of the present disclosure may be fabricated, in some implementations, utilizing a smaller overall area. In some implementations, the ESD protection devices of the present disclosure are associated with high holding voltages so that latch-up can be avoided.

FIG. 1 is a circuit schematic that illustrates an example of an ESD protection device 100. The ESD device 100 electrically couples to a high voltage device at a first terminal 103 (e.g., an anode). The ESD device 100 also electrically couples to a second terminal 105. The second terminal 105 may include, e.g., a ground terminal, or other sink for electrostatic discharge current.

The ESD protection device 100 is composed of two parts that are configured and arranged to provide ESD protection to high voltage devices. The first part of the ESD protection device 100 is a stage-by-stage turn on part. In the example shown in FIG. 1, the stage-by-stage turn on part includes a first transistor 102 (e.g., a first bipolar junction transistor). The first transistor 102 includes a first terminal 107, a second terminal 109 and a third terminal 111. The first terminal 107 (e.g., an emitter) of the first transistor 102 is electrically coupled to the second terminal 109 (e.g., a base) of the first transistor 102 by a first resistance (Rpoly 108). The first transistor 102 is operable to turn on when a first voltage is applied to the first terminal 107 of the first transistor 102. Thus, when the first transistor 102 is turned on, a first electrostatic discharge path is established.

The stage-by-stage turn on part also includes a second transistor 104 (e.g., a bipolar junction transistor). The second transistor 104 includes a first terminal 113, a second terminal 115, and a third terminal 117. The first terminal 113 (e.g., a collector) of the second transistor 104 is electrically coupled to the second terminal 109 of the first transistor 102 by a second resistance (Rwell 110). In addition, the third terminal 117 (e.g., an emitter) of the second transistor 104 is tied to (e.g., directly electrically coupled to) the third terminal 111 (e.g., a collector) of the first transistor 102. The second transistor 104 is operable to turn on when a second voltage is applied to the first terminal 107 of the first transistor 102. For the second transistor 104 to turn on, the second voltage should be greater than the first voltage. Thus, when the second transistor 104 is turned on, a second electrostatic discharge path is established.

The second part of the ESD protection device 100 includes a third transistor 106 (e.g., a bipolar junction transistor) that provides a main discharge path for electrostatic discharge current. The third transistor 106 includes a first terminal 119, a second terminal 121, and a third terminal 123. The first terminal 119 (e.g., a collector) of the third transistor 106 is tied to (e.g., directly electrically coupled to) the first terminal 113 of the second transistor 104. The second terminal 121 (e.g., a base) of the third transistor 106 is tied to (e.g., directly electrically coupled to) the second terminal 115 of the second transistor 104. The second terminal 121 of the third transistor 106 also is electrically coupled to the third terminal 123 (e.g., an emitter) of the third transistor 106 by a third resistance (Rwell 112). The third transistor 106 is operable to turn on when a third voltage is applied to the first terminal 107 of the first transistor 102. For the third transistor 106 to turn on, the third voltage should be greater than the second voltage. The third transistor 106 establishes a third electrostatic discharge path that corresponds to the main discharge path through which current may be discharged. That is, when all stages of the ESD protection device are turned on, the current will primarily flow through the third electrostatic discharge path. Thus, as the voltage of a high voltage device coupled to the anode 103 increase, the first transistor 102, second transistor 104 and third transistor 106 turn on in stages, with the amount of current being discharged increasing after each transistor is turned on.

The value of the first resistance 108 between the first terminal 107 (e.g., emitter) and the second terminal 109 (e.g., base) of the first transistor 102 may be used to adjust the voltage across the base and emitter (VBE) of a bipolar junction transistor. By changing the value of the first resistance 108 is, VBE can be adjusted so that, during an electrostatic discharge event, the trigger voltage of the ESD protection device 100 can be reduced.

The second and third resistances 110, 112 also can be used to adjust the operation of the ESD protection device 100. For example, the larger the value of the second resistance 110 between the second terminal 109 (the base) of the first transistor 102 and the first terminal 113 (the collector) of the second transistor 104, the more current can be driven through the first transistor 102. The smaller the value of the second resistance 110, the more current can be driven through the second transistor 104. Varying the value of the resistances 110, 112 also can be used to adjust the turn-on order of the first and second transistors 102, 104. For example, in some implementations, as the voltage at the anode increases, the second transistor 104 may be configured to turn on before the first transistor 102, whereas the first transistor 102 then may be configured to turn on after the second transistor 104 but before the third transistor 106.

Figure 2:
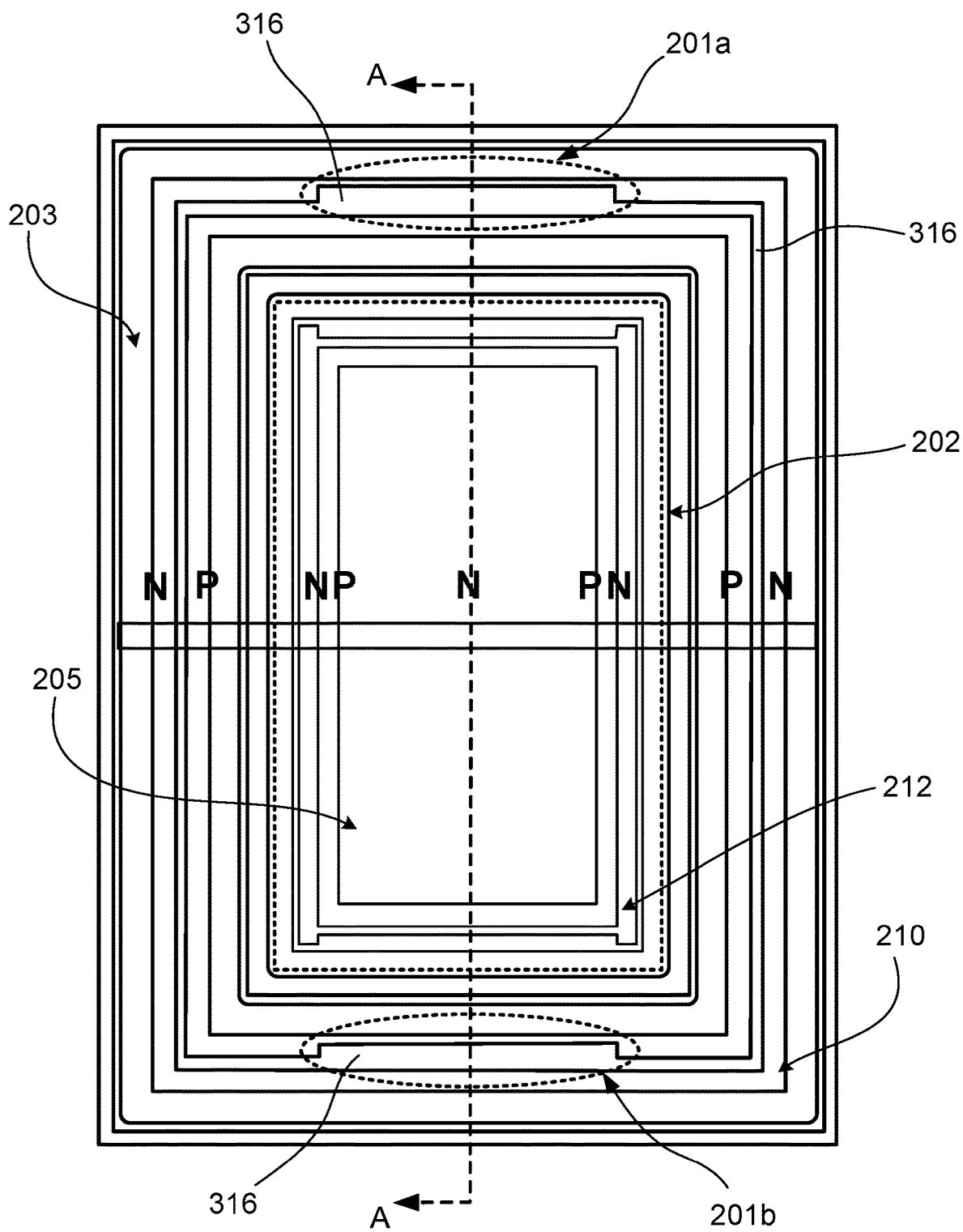
FIG. 2 is a schematic that illustrates a top view of an example of a semiconductor structure that includes an ESD protection device.
Figure 3:
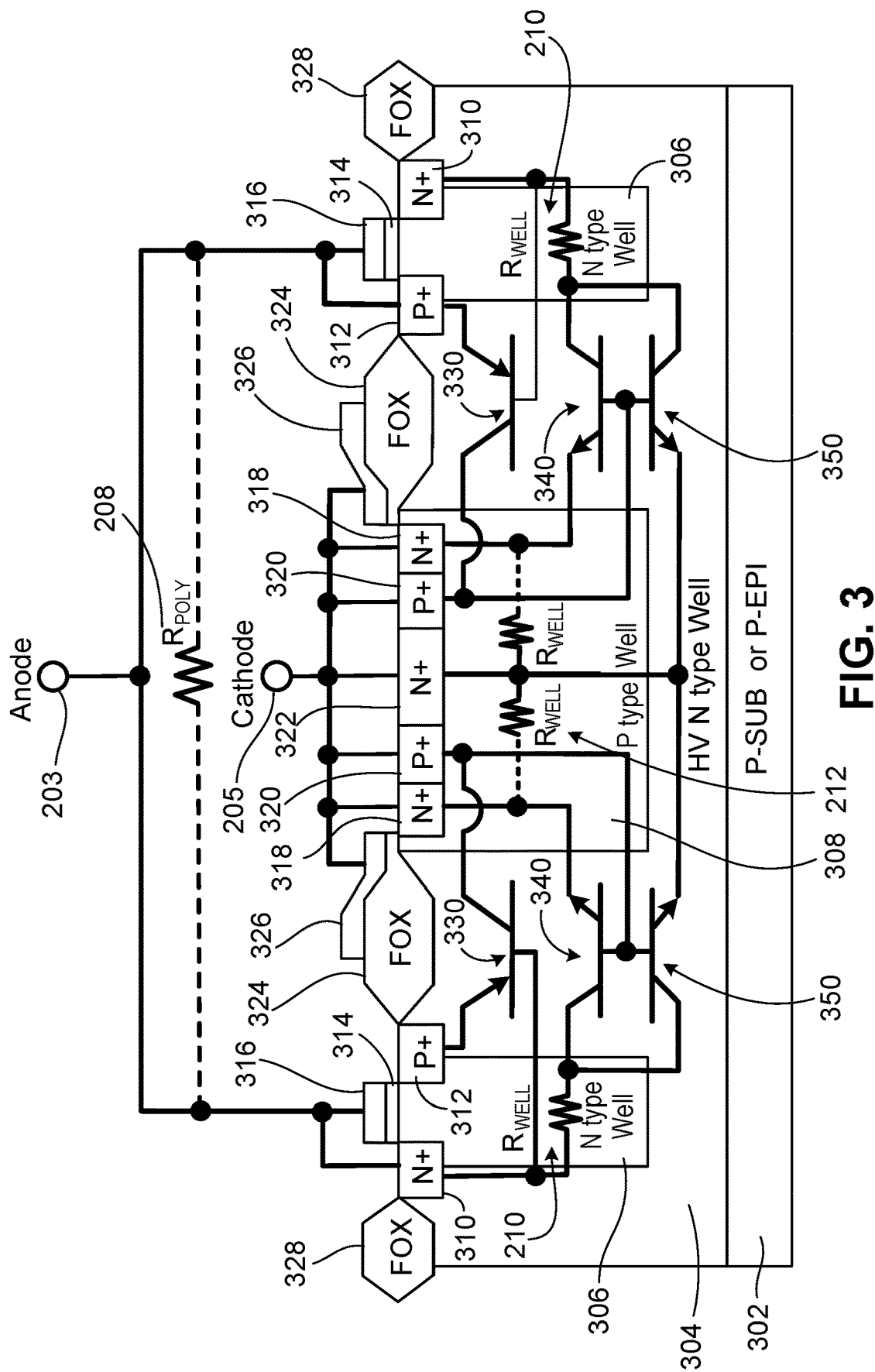
FIG. 3 is a schematic that illustrates a cross-section view along line AA of the exemplary semiconductor structure shown in FIG. 2.

FIG. 2 is a schematic that illustrates a top view of an example of a semiconductor structure that includes an ESD protection device, such as ESD protection device 100. FIG. 3 is a schematic that illustrates a cross-section view along line AA of the exemplary semiconductor structure shown in FIG. 2.

As shown in FIG. 3, the semiconductor structure includes a substrate 302. Substrate 302 may be a bulk material, such as buried P-type doped silicon wafer, or may be a material grown using an epitaxial process, such as a P-type epitaxial layer. The semiconductor structure also may include a first well 304 (e.g., a high voltage (HV) N-type well) formed on the substrate 302. The first well 304 may be formed to have the opposite doping type (e.g., N-type) of the substrate (e.g., P-type). The first well 304 may be grown using an epitaxial process. Alternatively, the first well 304 may be formed by ion implantation (e.g., an N-type well or an N+ well). In some implementations, the first well 304 includes multiple stacked layers (e.g., multiple stacked N+ wells).

The semiconductor structure further includes a second well 306 formed within the first well. The second well 306 includes a doped region (e.g., N-type or N– type well). The second well may be formed by ion implantation. From a top view of the semiconductor structure, the second well 306 is arranged in a ring. Since FIG. 3 depicts a cross-section through the semiconductor structure, second well 306 is depicted as two separate regions (e.g., a second well 306 on the left within FIG. 3 and a second well 306 on the right within FIG. 3). The second well 306 may be formed to have the same doping type (e.g., N-type), but higher concentration than the first well 304.

The second well 306 may be arranged such that it surrounds a third well 308. The third well 308 includes a doped region (e.g., P-type) formed by ion implantation. The doping type of the third well 308 may be the opposite doping type as that used for the second well 306, i.e., the same doping type as the substrate 302. The second well 306 can have a higher effective concentration than substrate 302. In some implementations, the third well 308 can include a P-type well stacked with a P+ layer or a P– layer.

As shown in FIG. 3, the semiconductor structure employs a three well structure (e.g., first well 304, second well 306, and third well 308) and thus is formed using a three-well process. In some implementations, however, the semiconductor structure employs two wells and thus may be formed from a corresponding two-well process. For example, in some implementations, the second well 306 and the third well 308, but not the first well 304, are formed (e.g., by ion implantation) in a buried layer of the substrate 302.

The second well 306 of the semiconductor structure includes a first N+ region 310 and a first P+ region 312. The first N+ region 310 is spaced apart from the first P+ region 312; the space between the first N+ region 310 and the first P+ region can be provided by the second well 306. The first P+ region 312 may be closer to the third well 308 than the first N+ region 310. Each of the first N+ region 310 and the first P+ region 312 can partially overlap the second well 306 as well as partially overlap the first well 304. The first N+ region 310 and the first P+ region 312 may be formed using, e.g., ion implantation.

An oxide layer 314 and a contact 316 may be positioned between the first N+ region 310 and the first P+ region 312 located within the second well 306. Each contact 316 may be tied to (e.g., directly electrically connected to) an anode 203. The contact 316 also may be tied to (e.g., directly electrically connected to) the first N+ region 310 (as shown in the left well 306 of FIG. 3) or the first P+ region 312 (as shown in the right well 306 of FIG. 3). The top view of FIG. 2 also shows that the contact 316 may be widened in a first region 201a to make contact with the first N+ region and the contact 316 may be widened in a second region 201b to make contact with the first P+ region. The contact 316 may be formed from a metal (e.g., aluminum, copper or titanium) or polysilicon.

The third well 308 of the semiconductor structure includes a second N+ region 318, a third N+ region 322, and a second P+ region 320. The second N+ region 318, the third N+ region 322, and the second P+ region 320 may be formed using ion implantation. The second N+ region 318 is arranged to surround the second P+ region 320. The second P+ region 320 is arranged to surround the third N+ region 322. Accordingly, as shown in FIG. 3, the second P+ region 320 is located between the second N+ region 318 and the third N+ region 322. That is, from a top view of the semiconductor structure, the second N+ region 318 is arranged in a ring around the second P+ region 320, and the second P+ region 320 is arranged in a ring around the third N+ region 322. The second N+ region 318, the second P+ region 320 and the third N+ region 322 are tied to (e.g., directly electrically connected to) a cathode 205.

A field oxide (FOX) film 324 can overlay the second well 304 in a region between the second N+ regions 318 of the third well 308 and the first P+ regions 312 of the second wells 306. The field oxide film 324 can be formed using a local oxidation of silicon (LOCOS) process. In some implementations, the field oxide film 324 can be formed using a shallow trench isolation oxide process.

Furthermore, the semiconductor structure includes a second contact 326 arranged on the field oxide film 324. The second contact can extend outwardly from an edge of the second N+ region across partially, but not entirely, across the field oxide film 324. The second contact 326 is tied to (e.g., directly electrically coupled to) the cathode 205 and to the second N+ region 318, the second P+ region 320, and the third N+ region 322. The second contact 326 thus forms a field plate (e.g., field plate 202 shown in FIG. 2) that surrounds the third well 308. The second contact 326 may be formed from polysilicon, metal or a multiple stacked layers of polysilicon and/or metal.

An additional field oxide 328 may be formed at the outer edges of the second wells 306, such that the additional field oxide 328 surrounds the second well 306.

In the semiconductor structure shown in FIG. 3, the first P+ region 312, the first well 304, the third well 308 and the second P+ region 320 form a first transistor 330 (e.g., a PNP bipolar junction transistor) that provides the functionality of the first transistor 102. The first N+ region 310, the second well 306, the first well 304, the third well 308 and the second N+ region 318 form a second transistor 340 (e.g., a NPN bipolar junction transistor) that provides the functionality of the second transistor 104. The second well 306 (and/or the first well 304), the third well 308 and the third N+ region 322 form a third transistor 350 (e.g., a NPN bipolar junction transistor) that provides the functionality of the third transistor 106. The first transistor 330, the second transistor 340, and the third transistor 350 thus are interconnected in a manner as shown in the circuit schematic of FIG. 1 to provide an ESD discharge protection device.

The first contact 316 provides the resistance (Rpoly) 208 (see FIGS. 2-3) between the first terminal (e.g., base) and the second terminal (e.g., emitter) of the first transistor 330. As explained herein, the value of the resistance 208 can be varied during fabrication in order to adjust the VBE of the first transistor 330. By increasing the value of resistance 208, the trigger voltage at which the ESD protection device begins to turn on can be reduced.

The second well 306 provides the well resistance 210 (see FIGS. 2-3) between the base of the PNP transistor (the first transistor 330) and the collector of the NPN transistor (the second transistor 350). As explained herein, by increasing the value of the well resistance 210, more current can be driven into the first transistor 330. On the other hand, decreasing the value of the well resistance can lead to more current being driven into the second transistor 340.

The third well 308 provides the well resistance 212 (see FIGS. 2-3) between the emitter of the third transistor 350 and the base/emitter of the second transistor 340. An increase in resistance 212 drives more current through transistor 330 and a decrease in resistance 212 drives more current through second transistor 340.

Figure 4:
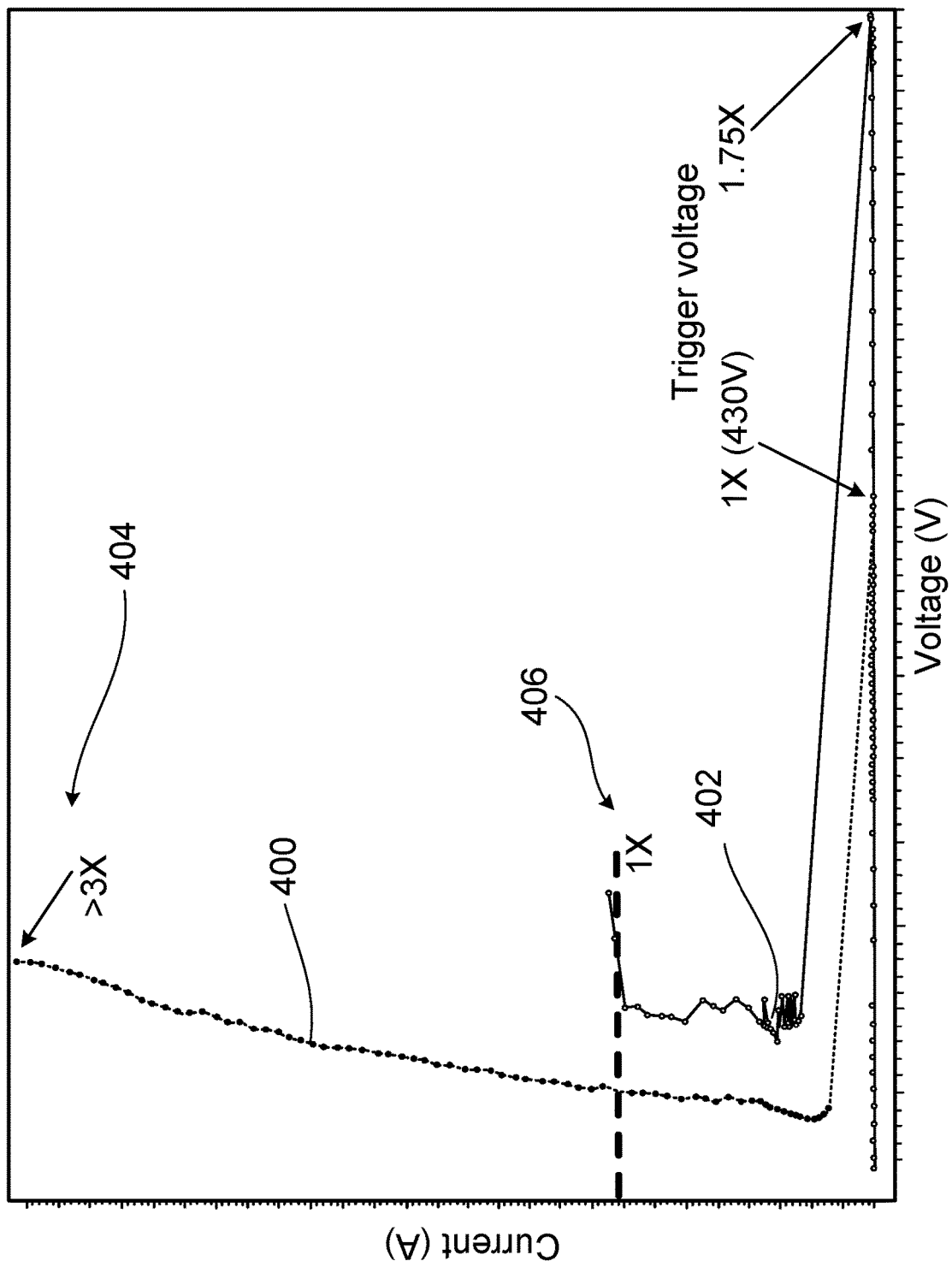
FIG. 4 is a plot illustrating a transmission-line pulse (TLP) I-V curve for an exemplary ESD protection device.

FIG. 4 is a plot illustrating a transmission-line pulse (TLP) I-V curve 400 for an exemplary ESD protection device (e.g., device 100) fabricated according to the present disclosure. The plot of FIG. 4 also illustrates a TLP I-V curve 402 measured for a conventional MOS ESD protection device.

As explained herein, the ESD protection device of the present disclosure is configured to turn on in stages. The trigger voltage associated with the ESD protection device of the present disclosure corresponds to the voltage at which the first stage turns on. As shown in the plot of FIG. 4, the trigger voltage for the exemplary ESD protection device was 40 V. In contrast, the trigger voltage for the conventional device occurred at a voltage that is 1.75 times higher (70 V). Furthermore, the level of current 404 that the exemplary ESD protection device is capable of discharging was over three times higher than the level of current 406 that the conventional ESD protection device is capable of discharging.

Figure 5:
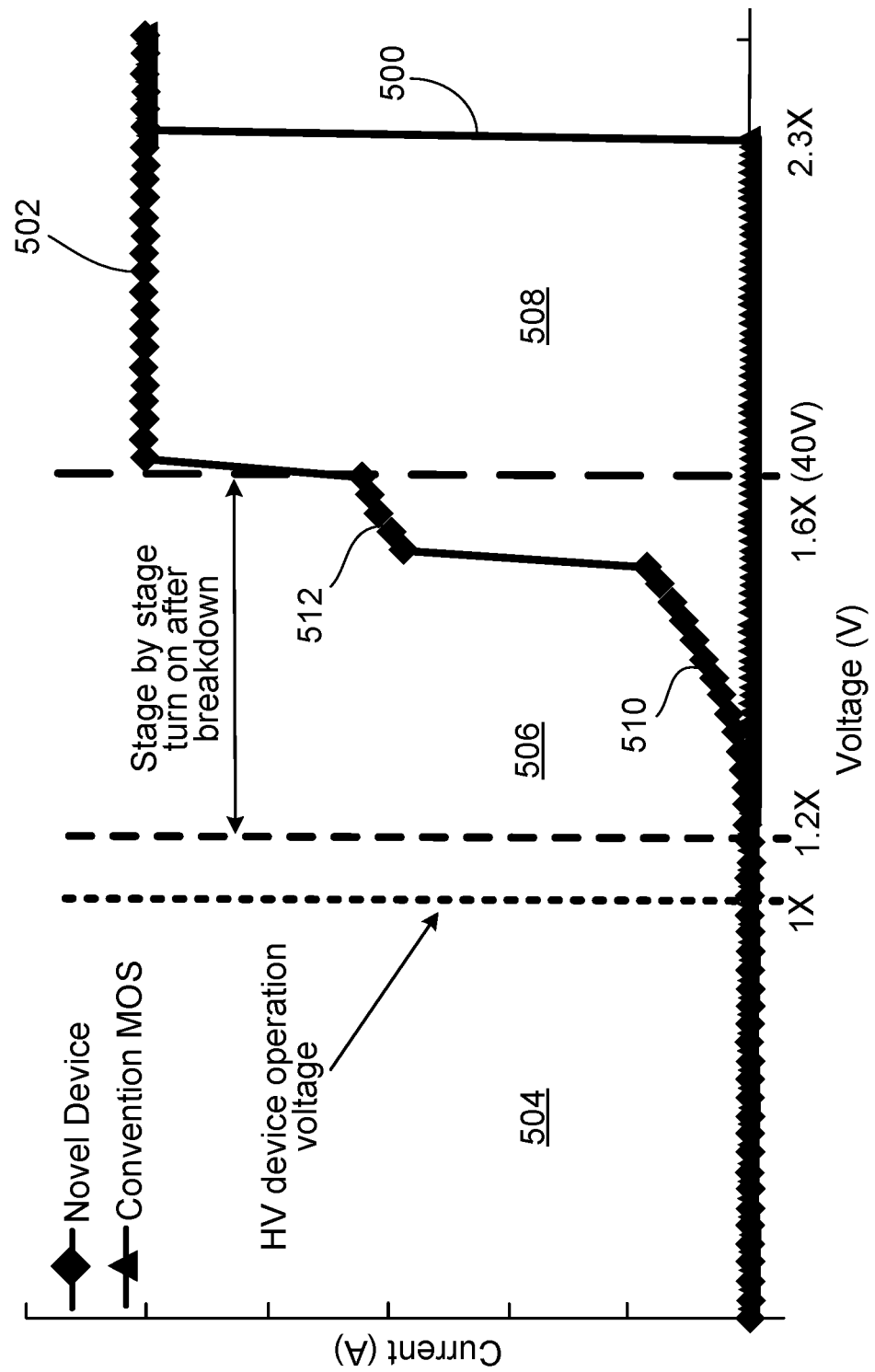
FIG. 5 is a plot illustrating an I-V curve of an exemplary ESD protection device.

FIG. 5 is a plot illustrating an I-V curve 500 of an exemplary ESD protection device (e.g., device 100) according to the present disclosure, as well as an I-V curve 502 of a conventional MOS ESD protection device. As shown in FIG. 5, the exemplary ESD protection device is operated in multiple stages as the voltage applied to the ESD devices increases. The dotted vertical line 501 is indicative of a turn-on voltage of a high voltage device that the ESD device are meant to protect. During a first range 504 of relatively low applied voltages, neither the ESD protection device of the present disclosure nor the conventional MOS ESD device turns on to discharge current. During a second range 506 (e.g., above 1.2×), where the applied voltage has increased, the stage-by-stage operation of the ESD protection according to the present disclosure is activated. The first stage of operation is represented by the curve portion 510. This is the current discharged by a first transistor (e.g., transistor 102) of the exemplary ESD protection device. As the applied voltage increases further (e.g., above 1.6×), the second stage of the exemplary ESD protection device turns on and is represented by curve portion 512. This is the current discharged by a second transistor (e.g., transistor 104) of the exemplary ESD protection device. As the applied voltage increases still further (e.g., above 40V) entering a third range 508, the main transistor (e.g., transistor 106) of the exemplary ESD protection device turns on, allowing even greater current to be discharged by the device. In contrast, the conventional MOS ESD protection device is not triggered until a much higher voltage (e.g., above 2.3×) is reached.

Figure 6:
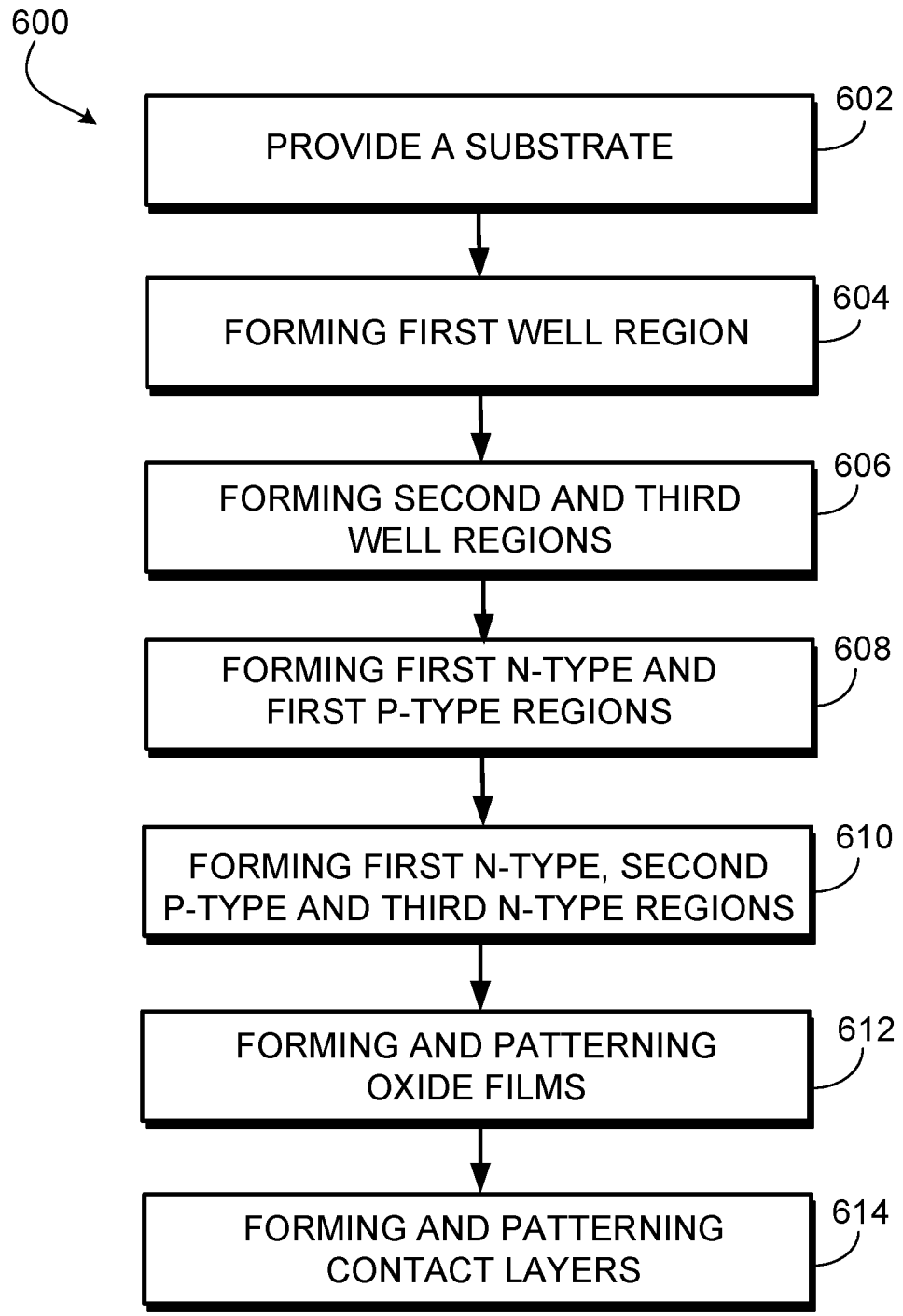
FIG. 6 is a flow chart depicting an example of a process for fabricating an ESD protection device.

FIG. 6 is a flow chart depicting an example of a process 600 that may be used to fabricate the ESD protection devices disclosed herein, such as the ESD protection device depicted in FIG. 3. The process steps used to form the different doped regions, the oxide layers and the metal layers, among other features of the ESD protection device as described herein, may include standard semiconductor integrated circuit manufacturing techniques, such as lithography, masking, deposition, lift-off and/or etching techniques.

Process 600 includes providing (602) a substrate (e.g., a P-type silicon substrate). A high voltage first well region (e.g., an N-type well region) is formed (604) on the substrate. The first well region may be formed using, e.g., epitaxy (e.g., Si epitaxy), diffusion, and/or ion bombardment. A second and third well region (e.g., N-type and P-type regions) are formed (606) on the substrate. The second and third well regions may be formed within the first well region or within the substrate, and may be spaced apart from one another. The second and third well regions may be formed using, e.g., ion implantation or an epitaxial semiconductor growth process. The second and third well regions may be heavily doped (e.g., N+ and P+) or lightly doped (e.g., N− and P−).

A first N-type region (e.g., heavily doped N+ region) and a first P-type region (e.g., heavily doped P+ region) are formed (608) within the second well. The first N-type region and the first P-type region may be spaced apart from one another. The first N-type and the first P-type regions may be formed using, e.g., ion implantation or an epitaxial semiconductor growth process. A second N-type region (e.g., heavily doped N+ region), a second P-type region (e.g., heavily doped P+ region), and a third N-type region (e.g., heavily doped N+ region) are formed (610) within the third well. The second N-type, the second P-type, and the third N-type regions may be formed using, e.g., ion implantation or an epitaxial semiconductor growth process.

A first and second oxide film are formed and patterned (612) on the substrate (e.g., on the surface of the first well). The oxide films can include silicon oxide films formed, e.g., using a LOCOS process. The process used to form the oxide films may include a shallow trench isolation oxide process. Alternatively, the oxide films may be formed using a deposition process. The second oxide film may be located on a surface of the device between the first P-type region and the second N-type region. The first oxide film may be located on a surface of the device between the first N-type region and the first P-type region.

Electrical contact layers are formed and patterned (614) on the oxide films. The electrical contact layers may include, e.g., polysilicon or metal layers. The contact films may be patterned so they are formed on the first and second oxide films, and couple to one or more of the first, second, and third N-type regions, and to one or more of the first and second P-type regions.

Implementations of the ESD protection device described herein may be fabricated using a BCD (Bipolar complimentary metal-oxide-semiconductor (BiCMOS) diffusion metal-oxide-semiconductor (DMOS)) process. Alternatively, or in addition, implementations of the ESD protection device described herein may be fabricated using an epitaxial process. Though the ESD protection devices described herein employ bipolar junction transistors, in some implementations, metal oxide semiconductor (MOS) transistors having opposite type (e.g., NMOS and PMOS) and field transistors having opposite type (e.g., N type and P type) may be used instead. Furthermore, although the ESD protection devices described herein are used in conjunction with high voltage devices, the ESD protection devices may be used in general DC circuit operations as well.

A number of implementations have been described. Nevertheless, it will be understood that various modifications may be made without departing from the spirit and scope of the invention. Accordingly, other implementations are within the scope of the following claims.

What is claimed is:

1. An electrostatic discharge protection device comprising:
    a semiconductor substrate;
    a first N-type doped well and a second N-type doped well on the substrate, each of the first N-type doped well and the second N-type doped well comprising a first N+ region and a first P+ region;
    a P-type doped well between the first N-type doped well and the second N-typed doped well on the substrate, the P-type doped well comprising a second N+ region, a third N+ region, and a second P+ region between the second N+ region and the third N+ region; and
    a first contact and a second contact positioned above a surface of the first N-type doped well and above a surface of the second N-type doped well, respectively, between the first N+ region and the first P+ region;
    a poly resistor connected between the first N-type doped well and the second N-typed doped well.

2. The device of claim 1, further comprising an additional N-type doped well, wherein the N-typed doped well and the P-typed doped well are arranged in the additional N-type doped well.

3. The device of claim 2, wherein the N-type doped well is separated from the P-typed doped well by the additional N-type doped well.

4. The device of claim 3, wherein the additional N-type doped well comprises an N-type epitaxial layer, an N+ buried layer or a plurality of N+ buried layers.

5. The device of claim 1, further comprising an oxide layer on the surface of the N-type doped well, wherein the first contact is arranged on the oxide layer.

6. The device of claim 1, further comprising a field oxide between the first P+ region and the second N+ region.

7. The device of claim 6, further comprising a second contact arranged on the field oxide, wherein the second contact is electrically coupled to the cathode.

8. The device of claim 7, wherein the second contact is polysilicon or metal.

9. The device of claim 6, wherein the field oxide is a shallow trench isolation layer.

10. The device of claim 1, wherein the P-type doped well comprises a P+ buried layer or a P− implant layer.

11. The device of claim 1, wherein the N-type doped well comprises an N−implanted layer.

12. The device of claim 1, wherein the first P+ region, the N-type doped well and the second P+ region form a first transistor,
    the N-type doped well, the P-type doped well and the second N+ region form a second transistor, the N-type doped well providing a first well resistance between a base of the first transistor and a collector of the second transistor, and
    the N-type doped well, the P-type doped well and the third N+ region form a third transistor, the P-type doped well providing a second well resistance between an emitter of the second transistor and an emitter of the third transistor.

13. The device of claim 12, wherein the first contact is electrically tied to an anode and to either the first N+ region or the first P+ region, and
    wherein the second N+ region, the third N+ region, and the second P+ region are electrically tied to a cathode
    wherein the first, second and third transistors are configured and arranged to provide conductions paths between the anode and the cathode that activate at different breakdown voltages, wherein the first transistor is operable to turn on when a first voltage is applied to the anode, the second transistor is operable to turn on when a second voltage is applied to the anode, the third transistor is operable to turn on when a third voltage is applied to the anode, and wherein the third voltage is greater than the second voltage, and the second voltage is greater than the first voltage.

14. A method of fabricating an electrostatic discharge protection device, the method comprising:

providing a substrate;

forming a first N-type well on the substrate;

forming a second N-type well and a first P-type well within the first N-type well;

forming a first N+ region and a first P+ region within the second N-type well, wherein the first N+ region and the first P+ region are spaced apart within the second N-type well;

forming a second N+ region, a second P+ region, and a third N+ region within the first P-type well, wherein the second P+ region separates the second N+ region from the third N+ region;

forming a first oxide layer, wherein the first oxide layer is between the first P+ region and the second N+ region;

forming a second oxide layer, wherein the second oxide layer is positioned between the first N+ region and the first P+ region; and forming a contact layer on the first oxide layer and on the second oxide layer.

* * * * *